(12) United States Patent
Huang et al.

(10) Patent No.: US 10,660,246 B1
(45) Date of Patent: May 19, 2020

(54) ELECTRONIC DEVICE AND ELECTROMAGNETIC SHIELDING ASSEMBLY THEREOF

(71) Applicant: PEGATRON CORPORATION, Taipei (TW)

(72) Inventors: Mei-Hsueh Huang, Taipei (TW); Jr-Hung Huang, Taipei (TW); Wen-Cheng Tsai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/671,201

(22) Filed: Nov. 1, 2019

(30) Foreign Application Priority Data

Nov. 14, 2018 (TW) .............................. 107140462 A

(51) Int. Cl.
*H05K 9/00* (2006.01)
(52) U.S. Cl.
CPC ................................ *H05K 9/0032* (2013.01)
(58) Field of Classification Search
CPC ......................................... H05K 9/0024–0037
See application file for complete search history.

(56) References Cited

U.S. PATENT DOCUMENTS

| | | | | |
|---|---|---|---|---|
| 5,488,784 A * | 2/1996 | Woodmansee | .......... | F26B 9/066 34/193 |
| 5,633,786 A * | 5/1997 | Matuszewski | ....... | H05K 9/0032 361/818 |
| 6,037,846 A * | 3/2000 | Oberhammer | ..... | H01R 13/7195 174/367 |
| 6,256,798 B1 | 7/2001 | Egolf et al. | | |
| 6,600,663 B1 * | 7/2003 | Koleda | ................ | B23K 1/0016 361/816 |
| 6,624,432 B1 * | 9/2003 | Gabower | ............. | H04B 1/3838 174/384 |
| 6,679,707 B1 * | 1/2004 | Brodsky | ................ | H05K 3/325 361/760 |
| 9,924,616 B2 | 3/2018 | Song et al. | | |
| 2005/0231932 A1 * | 10/2005 | Nestor | ................. | H05K 7/1461 361/818 |
| 2008/0153322 A1 * | 6/2008 | Liao | ..................... | H05K 7/1069 439/68 |
| 2009/0097223 A1 * | 4/2009 | Huang | ................. | H05K 9/0032 361/818 |
| 2009/0273912 A1 * | 11/2009 | Myers | .................. | H05K 9/0032 361/818 |

(Continued)

FOREIGN PATENT DOCUMENTS

| | | |
|---|---|---|
| CN | 1255836 A | 6/2000 |
| CN | 104936425 A | 9/2015 |

(Continued)

*Primary Examiner* — Hoa C Nguyen
(74) *Attorney, Agent, or Firm* — McClure, Qualey & Rodack, LLP

(57) ABSTRACT

An electromagnetic shielding assembly configured to be disposed on a circuit board with at least one electronic component includes a plurality of shielding housings. The shielding housings form a gap therebetween. Each of the shielding housings has a first opening adjoining the gap. The shielding housings are configured to accommodate part of the electronic component. The electronic component is configured to pass through the first openings of the shielding housings and the gap.

10 Claims, 6 Drawing Sheets

(56) References Cited

U.S. PATENT DOCUMENTS

| | | | | |
|---|---|---|---|---|
| 2010/0149780 A1* | 6/2010 | Ren | ..................... | H05K 9/0032 |
| | | | | 361/818 |
| 2013/0128482 A1* | 5/2013 | Qin | ..................... | H05K 9/0026 |
| | | | | 361/764 |
| 2015/0264844 A1* | 9/2015 | Jang | ..................... | H05K 1/023 |
| | | | | 361/784 |

FOREIGN PATENT DOCUMENTS

| CN | 206005099 U | 3/2017 |
|---|---|---|
| WO | 2014044066 A1 | 3/2014 |

* cited by examiner

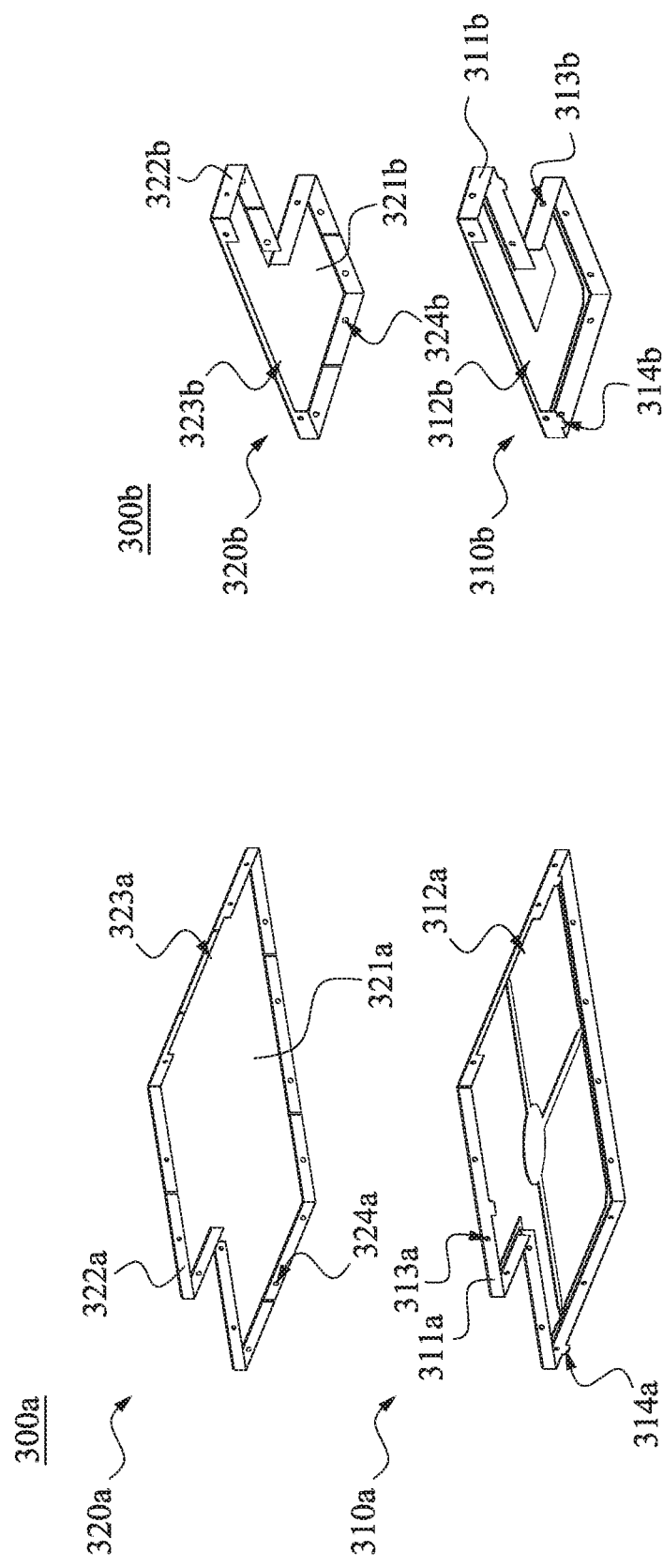

ELECTRONIC DEVICE AND ELECTROMAGNETIC SHIELDING ASSEMBLY THEREOF

RELATED APPLICATIONS

This application claims priority to Taiwan Application Serial Number 107140462, filed Nov. 14, 2018, the disclosure of which is incorporated herein by reference in its entirety.

BACKGROUND

Technical Field

The present disclosure relates to an electronic device having an electromagnetic shielding assembly.

Description of Related Art

A circuit board of an electronic device typically has multiple electronic components installed thereon. These electronic components are sometimes covered with electromagnetic shielding elements to protect the electronic components from electromagnetic interference (EMI).

In certain applications, each electronic component has to be covered by an individual shielding element, so to prevent interference between the electronic components resulted from the electromagnetic waves emitted by the electronic components. The employment of shielding elements reduce the available space on the circuit board since the space occupied by the side walls of the shielding elements, the area adjacent to the side walls and the area between the shielding elements are not available for circuit layout.

One way to deal with the problem of insufficient circuit board space is to enlarge the circuit board. However, such an approach has limitations and drawbacks such as an increase in weight of the electronic device and a potential need to redesign the chassis (e.g., to accommodate the enlarged circuit board).

Consequently, how to provide an electromagnetic shielding element to resolve the aforementioned issues is one of the directions that should be urgently endeavored.

SUMMARY

In view of the foregoing, one of the objects of the present disclosure is to provide an electromagnetic shielding assembly that improves the efficiency of space utilization.

To achieve the objective stated above, in accordance with an embodiment of the present disclosure, an electromagnetic shielding assembly configured to be disposed on a circuit board with at least one electronic component includes a plurality of shielding housings. The shielding housings form a gap therebetween. Each of the shielding housings has a first opening adjoining the gap. The shielding housings are configured to accommodate part of the electronic component. The electronic component is configured to pass through the first openings of the shielding housings and the gap.

In one or more embodiments of the present disclosure, each of the shielding housing includes a frame and a lid. The frame is fixedly attached to the circuit board and has a first side wall. The first opening is formed on the first side wall.

In one or more embodiments of the present disclosure, the lid includes a top wall and a second side wall. The second side wall is connected to the top wall and extends to an outer side of the first side wall of the frame. The second side wall has a second opening positioned corresponding to first opening.

In one or more embodiments of the present disclosure, the first side wall has an engaging slot. The second side wall has a protrusion interlocking with the engaging slot.

In one or more embodiments of the present disclosure, the first side wall has a plurality of fixing portions. The fixing portions are arranged on a periphery of the first side wall and are configured to be secured on the circuit board.

In one or more embodiments of the present disclosure, a width of the gap is less than or equal to 1.6 mm.

In accordance with an embodiment of the present disclosure, an electronic device includes a circuit board and an electromagnetic shielding assembly. The circuit board has at least one electronic component. The electromagnetic shielding assembly is disposed on the circuit board. The electromagnetic shielding assembly includes a plurality of shielding housings forming a gap therebetween. Each of the shielding housings has a first opening adjoining the gap. The shielding housings accommodate part of the electronic component. The electronic component passes through the first openings of the shielding housings and the gap.

In sum, the electromagnetic shielding assembly of the present disclosure is featured with two neighboring shielding housings each having a side opening. The side openings are configured to face each other. Consequently, the available space on the circuit board is increased as the area between the side openings is made available for circuit layout.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

FIG. 4 is an exploded view of the shielding housing shown in FIG. 2 taken from another angle;

FIG. 5 is an exploded view of the shielding housing shown in FIG. 3 taken from another angle;

DETAILED DESCRIPTION

Figure 1:
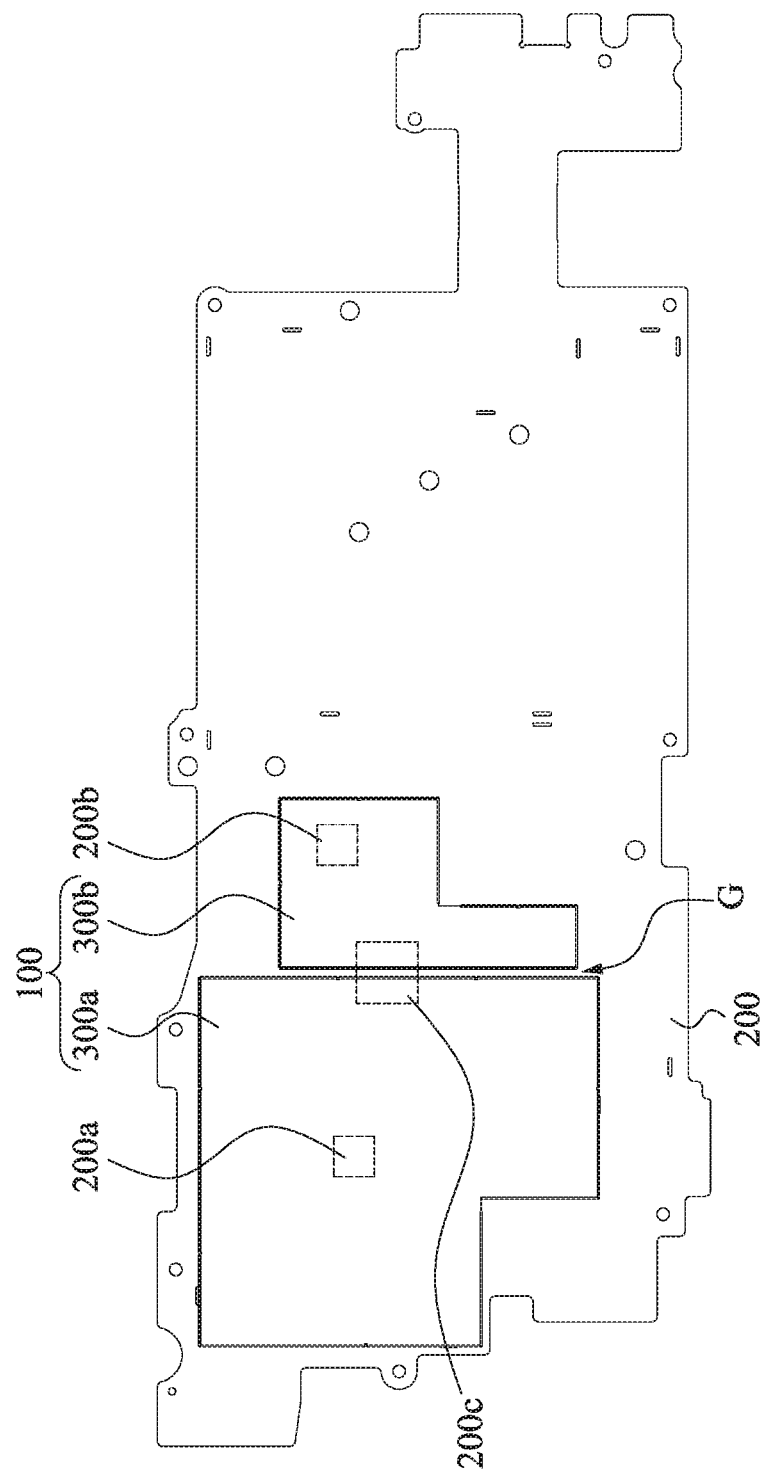
FIG. 1 illustrates a top view of an electromagnetic shielding assembly in accordance with an embodiment of the present disclosure, with the electromagnetic shielding assembly being disposed on a circuit board.

For the sake of the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions.

However, a person with an ordinary skill in relevant art should realize that the present disclosure can be implemented without one or more of the practical details. Therefore, the present disclosure is not to be limited by these details.

Reference is made to FIG. 1, which illustrates a top view of an electromagnetic shielding assembly 100 in accordance with an embodiment of the present disclosure. The electromagnetic shielding assembly 100 is disposed on a circuit board 200. As shown in FIG. 1, the electromagnetic shielding assembly 100 includes two shielding housings 300a and 300b. The shielding housings 300a and 300b cover electronic components 200a and 200b (depicted with dashed lines in FIG. 1) on the circuit board 200 respectively, so as to protect the electronic components 200a and 200b from electromagnetic interference (EMI). The shielding housings 300a and 300b are physically separated such that a gap G is formed between the shielding housings 300a and 300b. The electromagnetic shielding assembly 100 may be made of metal or other conductive materials to enable the shielding capability of the electromagnetic shielding assembly 100. Alternatively, the electromagnetic shielding assembly 100 may have metallic coatings.

Figure 2:
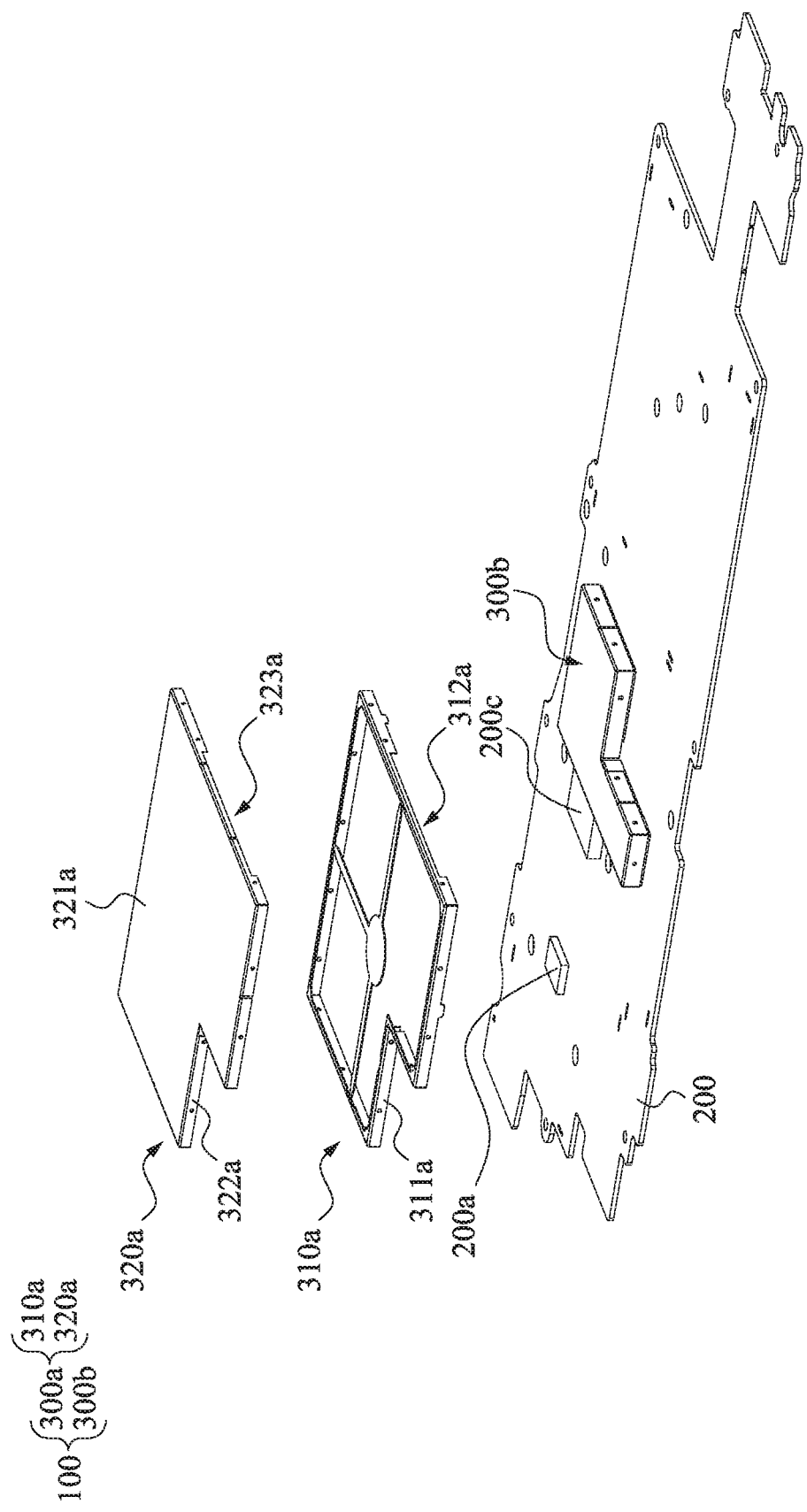
FIG. 2 is an exploded view of one of the shielding housings of the electromagnetic shielding assembly shown in FIG. 1.
Figure 3:
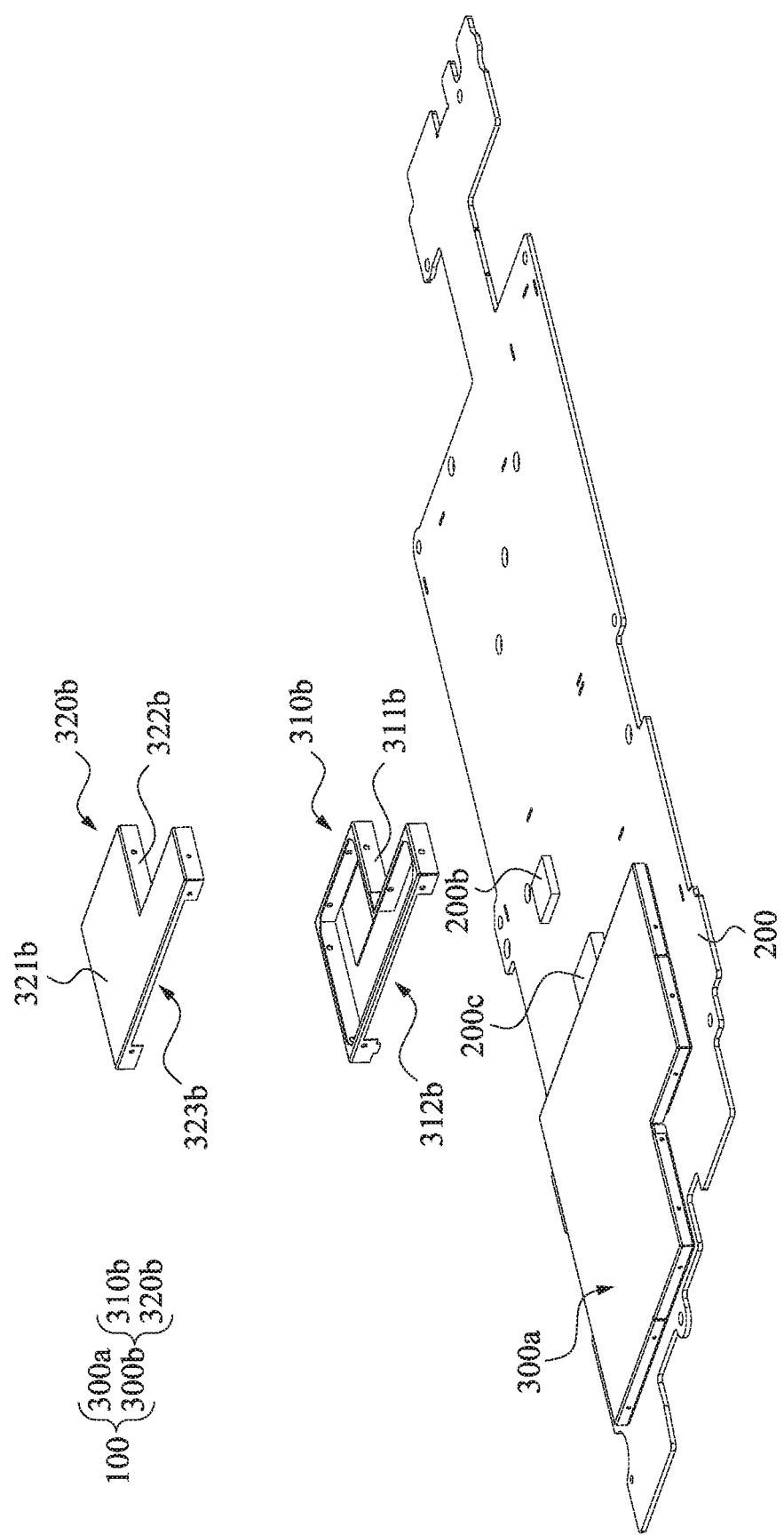
FIG. 3 is an exploded view of the other one of the shielding housings of the electromagnetic shielding assembly shown in FIG. 1.

Reference is made to FIGS. 2 and 3, which are exploded views of the shielding housings 300a and 300b of the electromagnetic shielding assembly 100 respectively. The shielding housing 300a includes a frame 310a and a lid 320a. The shielding housing 300b includes a frame 310b and a lid 320b. The frames 310a and 310b are fixedly attached to the circuit board 200. The frame 310a has a first side wall 311a and the frame 310b has a first side wall 311b. The lid 320a covers a side of the frame 310a away from the circuit board 200, such that the lid 320a, the first side wall 311a of the frame 310a and the circuit board 200 form a shielded space therebetween. The lid 320b covers a side of the frame 310b away from the circuit board 200, such that the lid 320b, the first side wall 311b of the frame 310b and the circuit board 200 form another shielded space therebetween. The electronic components 200a and 200b which are disposed in said shielding spaces are free of EMI accordingly.

As shown in FIGS. 2 and 3, the first side wall 311a has a first opening 312a adjoining the gap G. The first side wall 311b has a first opening 312b adjoining the gap G. The first opening 312a of the first side wall 311a and the first opening 312b of the first side wall 311b face each other across the gap G. The formation of the first openings 312a and 312b enables the gap G to be utilized for circuit layout and increases the available space on the circuit board 200 accordingly. For instance, as shown in FIG. 1, a third electronic component 200c may be partially accommodated in the shielding housings 300a and 300b, and passes through the gap G and the first openings 312a and 312b. In other words, the electronic component 200c has a first portion located within the shielding housing 300a, a second portion located within the shielding housing 300b and a third portion located within the gap G.

It is to be noted that the space between the lid 320a, the first side wall 311a and the circuit board 200 is not a closed space since the first opening 312a is formed on the first side wall 311a. Likewise, the space between the lid 320b, the first side wall 311b and the circuit board 200 is also not a closed space. Consequently, to provide effective EMI shielding to the electronic components 200a, 200b and 200c, a width W of the gap G (see FIG. 6) has to be less than or equal to a predetermined effective shielding width. In some embodiments, the width W of the gap G substantially falls within a range of 1.4 mm to 1.6 mm.

The numbers provided above are only examples. The width W of the gap G may be adjusted to take account of the requirements in different application scenarios. For instance, the width W of the gap G may be reduced if the electronic components 200a, 200b and 200c are highly susceptible to external electromagnetic waves. The width W of the gap G may be adjusted by changing the sizes, the shapes and the positions of the shielding housings 300a and 300b, or using other suitable means.

In some embodiments, as shown in FIG. 2, the lid 320a includes a top wall 321a and a second side wall 322a connected to the top wall 321a. The top wall 321a covers the frame 310a. The second side wall 322a extends to an outer side of the first side wall 311a and has a second opening 323a positioned corresponding to first opening 312a. The second opening 322a has dimension greater than or equal to the dimension of the first opening 312a, so as to prevent the first opening 312a and the electronic component 200c from being blocked by the second side wall 322a.

As shown in FIG. 3, the lid 320b of the shielding housing 300b includes a top wall 321b and a second side wall 322b with a second opening 323b. The top wall 321b, the second side wall 322b and the second opening 323b are structurally similar to the top wall 321a, the second side wall 322a and the second opening 323a respectively. Please refer to the preceding paragraphs for the descriptions regarding the top wall 321a, the second side wall 322a and the second opening 323a. They are not repeated herein for brevity.

Reference is made to FIG. 4, which is an exploded view of the shielding housing 300a shown in FIG. 2 taken from another angle. In some embodiments, the first side wall 311a has a plurality of engaging slots 313a. The second side wall 322a has a plurality of protrusions 324a. Each of the protrusions 324a interlocks with a corresponding engaging slot 313a to hold the lid 320a and the frame 310a firmly together. Therefore, the lid 320a may be prevented from inadvertently detaching from the frame 310a, which would result in the shielding housing 300a being unable to provide EMI shielding for the electronic components. In addition, compared to other fixation means (e.g., assembling the lid 320a and the frame 310a by screwing), the aforementioned engaging structures (i.e., the engaging slots 313a and the protrusions 324a) facilitate easy assembly and disassembly of the shielding housing 300a. Accordingly, the electronic components 200a may be replaced effortlessly.

In some embodiments, as shown in FIG. 4, the first side wall 311a has a plurality of fixing portions 314a. The fixing portions 314a are arranged on a periphery of the first side wall 311a and are configured to be secured on the circuit board 200.

Reference is made to FIG. 5, which is an exploded view of the shielding housing 300b shown in FIG. 3 taken from another angle. The first side wall 311b of the frame 310b has engaging slots 313b and the second side wall 322b has protrusions 324b. The engaging slots 313b and the protrusions 324b are structurally similar to the engaging slots 313a and the protrusions 324a. The first side wall 311b further has at least one fixing portion 314b, which is structurally similar to the fixing portion 314a. Please refer to the preceding paragraphs for the descriptions regarding the engaging slots 313a, the protrusions 324a and the fixing portion 314a. They are not repeated herein for brevity.

Figure 6:
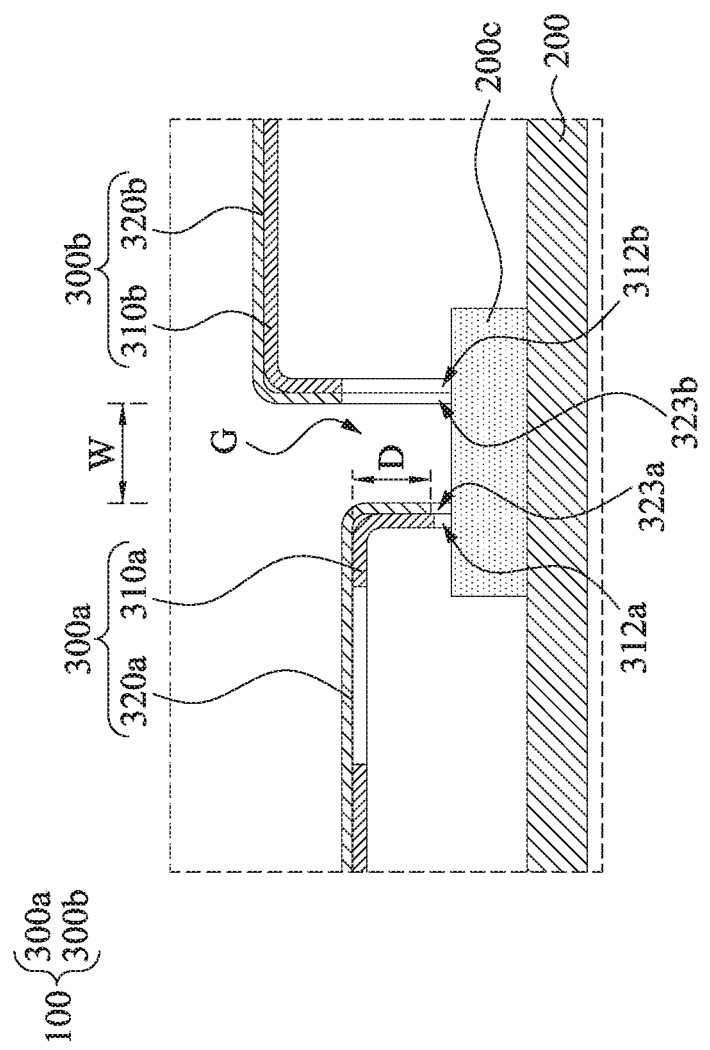
FIG. 6 is a partially enlarged cross sectional view of the electromagnetic shielding assembly and the circuit board shown in FIG. 1.

Reference is made to FIG. 6, which is a partially enlarged cross sectional view of the electromagnetic shielding assembly 100 and the circuit board 200 shown in FIG. 1. The height of the second opening 323a depends on a distance D from an upper edge of the second opening 323a to the top wall 321a. In some embodiments, the lid 320a is formed by means of sheet metal bending. The second side wall 322a is bending from the top wall 321a by substantially 90 degrees. In cases where the lid 320a is manufactured by means of bending process, the distance D is required to be greater than or equal to a minimum bended edge length, which depends on the material of the sheet metal, the thickness of the sheet metal and/or other properties. In some embodiments, the minimum bended edge length is substantially 1.1 mm.

The numbers provided above are only examples. The height of the second opening 323a (or the distance D) may be adjusted to take account of the requirements in different application scenarios. For instance, to accommodate taller electronic components, the distance D may be reduced and the height of the second opening 323a may be increased.

Figure 7:
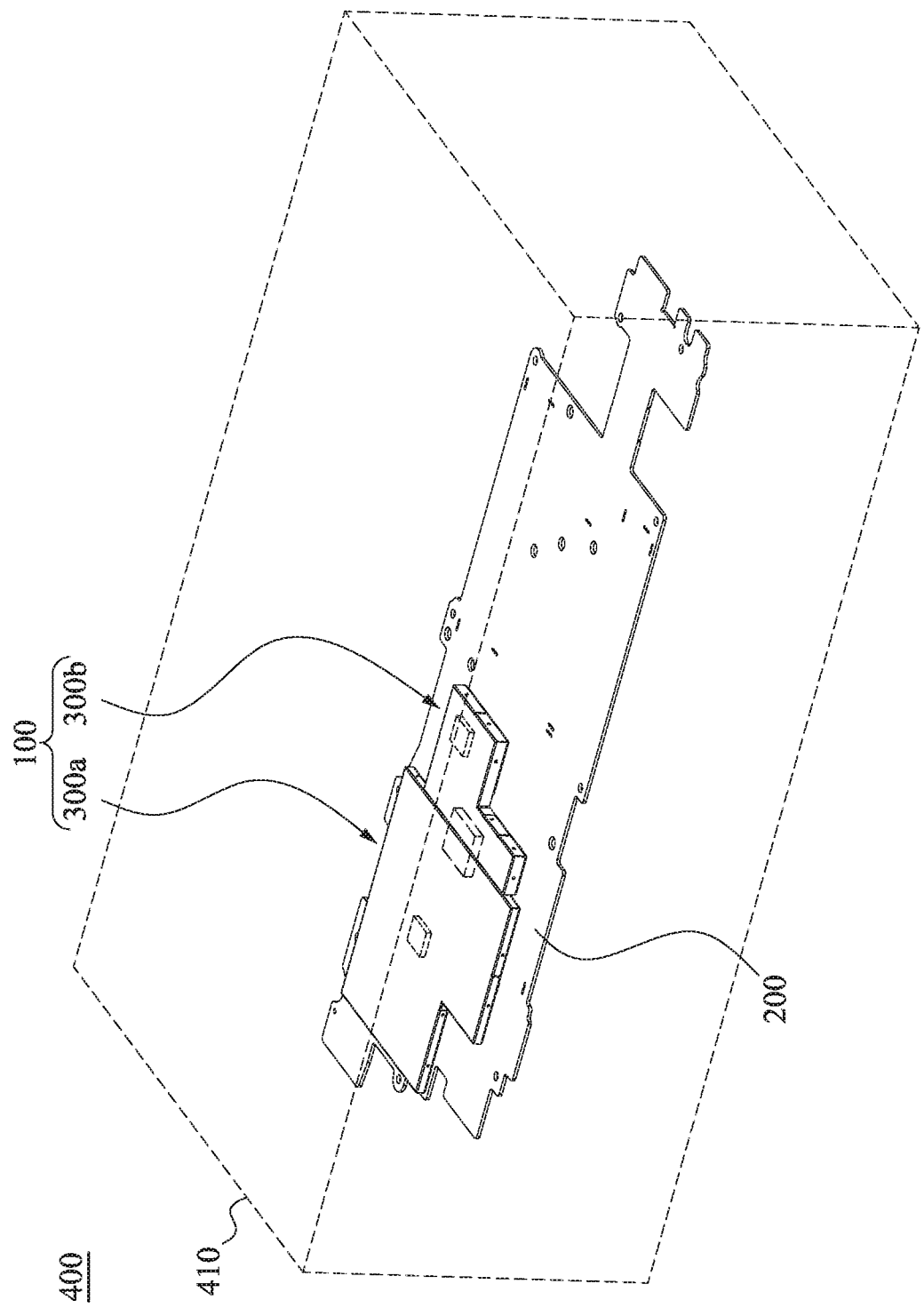
FIG. 7 illustrates a perspective view of an electronic device in accordance with an embodiment of the present disclosure.

Reference is made to FIG. 7, which illustrates a perspective view of an electronic device 400 in accordance with an embodiment of the present disclosure. The electronic device 400 (e.g., a mobile device) includes a chassis 410 (depicted with dashed lines in FIG. 7) and the electromagnetic shielding assembly 100 and the circuit board 200 shown in FIG. 1. The electromagnetic shielding assembly 100 and the circuit board 200 are disposed in the chassis 410. Compared to conventional EMI shielding tools, the electromagnetic shielding assembly 100 of the present disclosure improves utilization efficiency of the space on the circuit board 200 by introducing additional circuit layout space. Consequently, the size of the circuit board 200 may be reduced, enabling thinner and lighter design for the electronic device 400.

It is to be noted that the technical means specified above may be generalized to electromagnetic shielding assembly with three or more shielding housings. In such embodiments, a gap may be formed between any pair of neighboring shielding housings and the pair of shielding housings may each have a side opening. The side openings of the pair of shielding housings may face each other across said gap. Accordingly, the space available for circuit layout may be increased.

In sum, the electromagnetic shielding assembly of the present disclosure is featured with two neighboring shielding housings each having a side opening. The side openings are configured to face each other. Consequently, the available space on the circuit board is increased as the area between the side openings is made available for circuit layout.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. An electromagnetic shielding assembly configured to be disposed on a circuit board, the circuit board having at least one electronic component, the electromagnetic shielding assembly comprising:
   a plurality of shielding housings forming a gap therebetween, wherein each of the shielding housings has a first opening adjoining the gap, the shielding housings are configured to accommodate part of the at least one electronic component, and the at least one electronic component is configured to pass through the first openings of the shielding housings and the gap.

2. The electromagnetic shielding assembly of claim 1, wherein each of the shielding housings comprises:
   a frame fixedly attached to the circuit board, the frame having a first side wall, the first opening being formed on the first side wall; and
   a lid covering the frame to shield the at least one electronic component.

3. The electromagnetic shielding assembly of claim 2, wherein the lid comprises:
   a top wall; and
   a second side wall connected to the top wall and extending to an outer side of the first side wall of the frame, the second side wall having a second opening positioned corresponding to first opening.

4. The electromagnetic shielding assembly of claim 3, wherein the first side wall has an engaging slot, the second side wall has a protrusion interlocking with the engaging slot.

5. The electromagnetic shielding assembly of claim 2, wherein the first side wall has a plurality of fixing portions, the fixing portions are arranged on a periphery of the first side wall and are configured to be secured on the circuit board.

6. The electromagnetic shielding assembly of claim 1, wherein a width of the gap is less than or equal to 1.6 mm.

7. An electronic device, comprising:
   a circuit board having at least one electronic component; and
   an electromagnetic shielding assembly disposed on the circuit board and comprising a plurality of shielding housings, wherein the shielding housings form a gap therebetween, each of the shielding housings has a first opening adjoining the gap, the shielding housings accommodate part of the at least one electronic component, and the at least one electronic component passes through the first openings of the shielding housings and the gap.

8. The electronic device of claim 7, wherein each of the shielding housings comprises:
   a frame fixedly attached to the circuit board, the frame having a first side wall, the first opening being formed on the first side wall; and
   a lid covering the frame to shield the at least one electronic component.

9. The electronic device of claim 8, wherein the lid comprises:
   a top wall; and
   a second side wall connected to the top wall and extending to an outer side of the first side wall of the frame, the second side wall having a second opening positioned corresponding to first opening.

10. The electronic device of claim 7, wherein a width of the gap is less than or equal to 1.6 mm.

* * * * *